United States Patent
Noda et al.

(10) Patent No.: US 8,155,535 B2
(45) Date of Patent: Apr. 10, 2012

(54) OPTICAL RECEIVER

(75) Inventors: Masaki Noda, Tokyo (JP); Masamichi Nogami, Tokyo (JP); Junichi Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 908 days.

(21) Appl. No.: 12/086,292

(22) PCT Filed: Mar. 3, 2006

(86) PCT No.: PCT/JP2006/304098
§ 371 (c)(1),
(2), (4) Date: Jun. 10, 2008

(87) PCT Pub. No.: WO2007/102189
PCT Pub. Date: Sep. 13, 2007

(65) Prior Publication Data
US 2009/0252504 A1    Oct. 8, 2009

(51) Int. Cl.
*H04B 10/06* (2006.01)

(52) U.S. Cl. ........ 398/202; 398/203; 398/204; 398/205; 398/206; 398/207; 398/208; 398/209; 398/210; 398/211; 398/212; 398/213; 398/214

(58) Field of Classification Search .................. None
See application file for complete search history.

(56) References Cited

U.S. PATENT DOCUMENTS

| | | | |
|---|---|---|---|
| 3,930,727 A * | 1/1976 | Vergato | 356/326 |
| 6,084,478 A * | 7/2000 | Mayampurath | 330/308 |
| 6,246,282 B1 * | 6/2001 | Oono et al. | 330/86 |
| 2003/0206126 A1 | 11/2003 | Kubota | |
| 2007/0071455 A1 * | 3/2007 | Margalit et al. | 398/202 |

FOREIGN PATENT DOCUMENTS

| | | |
|---|---|---|
| DE | 10223964 B3 | 1/2004 |
| JP | 2-72748 A | 3/1990 |
| JP | 6-216954 A | 8/1994 |
| JP | 6-91481 B2 | 11/1994 |
| JP | 8-12979 A | 2/1996 |
| JP | 8-51329 A | 2/1996 |
| JP | 3141863 B2 | 12/2000 |
| JP | 2002-330040 A | 11/2002 |
| JP | 2003-318997 A | 11/2003 |

OTHER PUBLICATIONS

Nakamura et al., A 156-Mb/s CMOS Optical Receiver for Burst-Mode Transmission, IEEE Journal of Solid-State Circuits, vol. 33, No. 8, Aug. 1998, pp. 1179-1187.

* cited by examiner

*Primary Examiner* — Kenneth N Vanderpuye
*Assistant Examiner* — Darren E Wolf
(74) *Attorney, Agent, or Firm* — Birch, Stewart, Kolasch & Birch, LLP

(57) ABSTRACT

An optical receiver for stably reproducing packets having different light receiving levels is disclosed. The optical receiver includes: a light receiving element for outputting a current in response to a light receiving level of an optical signal; a preamplifier for converting the current signal outputted from the light receiving element into a voltage signal; a circuit for detecting a consecutive same binary symbols portion from a binary symbols stream of the voltage signal outputted from the preamplifier to output a time constant switching signal in response to a detection result thereof; a level detecting circuit for detecting a voltage level of the voltage signal outputted from the preamplifier based upon a time constant which is switched/controlled in response to the time constant switching signal; and an amplifier for amplifying an output voltage of the level detecting circuit to apply a control voltage for controlling the gain to the preamplifier.

10 Claims, 7 Drawing Sheets

OPTICAL RECEIVER

TECHNICAL FIELD

The present invention relates to an optical communication system, and more specifically, to an optical receiver which is employed in a passive optical network (PON) system corresponding to one of access optical communication systems.

BACKGROUND ART

Conventionally, "point-to-multi-point" access optical communication systems called passive optical network (PON) systems have been widely employed as systems capable of realizing public networks using optical fibers.

A PON system includes one set of optical line terminal (OLT) which is a station-side apparatus, and optical network units (ONUs) corresponding to a plurality of subscriber terminal apparatuses and connected via an optical star coupler to the OLT. Currently, the PON systems have been actively introduced in order to realize broadband networks from the following merits: since a major portion of optical fibers corresponding to transmission paths can be commonly used with the OLT for a large number of ONUs, lower operation cost can be expected; an optical star coupler corresponding to a passive component has no need for power feeding and can be easily set outdoors; and also reliability thereof is high.

For instance, in Gigabit Ethernet (registered trademark)-passive optical network (GE-PON) whose transmission speed is 1.25 Gbit/s and which is standardized in IEEE 802.3ah, in a downlink from an OLT to ONUs, there is employed a broadcast communication system using an optical wavelength 1.49 μm band, and the respective ONUs derive only data of the allocated time slots. On the other hand, in an uplink from the respective ONUs to the OLT, an optical wavelength 1.31 μm band is employed, and a time division multiplexing communication system is employed by which transmission timing is controlled in order that data of the respective ONUs do not collide with each other.

In communication of the uplink direction of the above-mentioned PON system, because the respective ONUs are located at different distances from the optical star coupler, reception levels of the respective ONUs in the OLT are different for every reception packet. As a result, a wide dynamic range characteristic capable of stably reproducing packets which have light receiving levels different from each other is required for a receiving circuit of the OLT. As a consequence, generally speaking, there is provided an automatic gain control (AGC) circuit in a receiving circuit of an OLT, which changes a conversion gain in response to a light receiving level.

Various types of AGC circuits have been proposed, and there is an AGC type circuit in which a feedback resistance value of a preamplifier is switched in a stepwise manner in response to a light receiving level (refer to, for example, Patent Document 1). Also, there is another AGC type circuit in which a feedback resistance value of a preamplifier is switched in an analog mode in response to a light receiving level (refer to, for example, Patent Document 2). Also, there is a further AGC type circuit having such a function that an amplification factor is changed in an analog mode, and a time constant of an AGC loop is also changed at the same time (refer to, for instance, Patent Document 3).

Patent Document 1: JP 2000-151290A
Patent Document 2: JP 07-38342 A
Patent Document 3: JP 06-91481 A

DISCLOSURE OF THE INVENTION

Problems to be Solved by the Invention

However, in the technique described in the above-mentioned Patent Document 1, there is a problem. That is, when the level of the burst signal to be received is varied in a transient manner, especially, when the level of the optical signal is converged to a constant level after an excessive light emission has occurred, the conversion gain is erroneously switched. Also, the technique disclosed in the above-mentioned Patent Document 2 has such a problem that due to the restriction of the AGC loop time constant, both the high-speed responsiveness and the consecutive same binary symbols tolerance can hardly be established at the same time. Also, although the technique disclosed in the above-mentioned Patent Document 3 has the function of switching the time constants of the AGC loop in order to establish both the high-speed responsiveness and the consecutive same binary symbols tolerance at the same time, such a preamble section that the data stream is the fixed pattern made of "1, 0, 1, 0, ..." must be provided at the head of the burst signal in order to accomplish the converging operation of the AGC. As a result, the effect thereof is limited.

The present invention has been made to solve the above-mentioned problems, and therefore, has an object to provide an optical receiver which has a wide dynamic range characteristic capable of stably reproducing packets having different light receiving levels, and further, has both a superior high-speed responsiveness and superior consecutive same binary symbols tolerance mainly in the PON system, which is one of the access optical communication systems.

Means for Solving the Problems

An optical receiver according to the present invention includes: a light receiving element for outputting a current in response to a light receiving level of an optical signal; a preamplifier whose gain is controlled in a variable manner based upon a control voltage, for converting the current signal outputted from the light receiving element into a voltage signal; consecutive same binary symbols detecting means for detecting a consecutive same binary symbols portion from a binary symbols stream of the voltage signal outputted from the preamplifier to output a time constant switching signal in response to a detection result thereof; level detecting means for detecting a voltage level of the voltage signal outputted from the preamplifier based upon a time constant which is switched/controlled in response to the time constant switching signal from the consecutive same binary symbols detecting means; and amplifying means for amplifying an output voltage of the level detecting circuit to apply a control voltage for controlling the gain to the preamplifier.

Effects of the Invention

In accordance with the present invention, the consecutive same binary symbols portion is detected from the binary symbols stream of the received signal. When the same binary symbols are consecutive, the time constant of the AGC loop is made long, and when different binary symbols are consecutive, the time constant of the AGC loop is made short. As a consequence, there is provided the optical receiver which has a wide dynamic range characteristic for stably reproducing packets having different light receiving levels, and which is superior in high-speed responsiveness and consecutive same binary symbols tolerance.

BEST MODE FOR CARRYING OUT THE INVENTION

Figure 1:
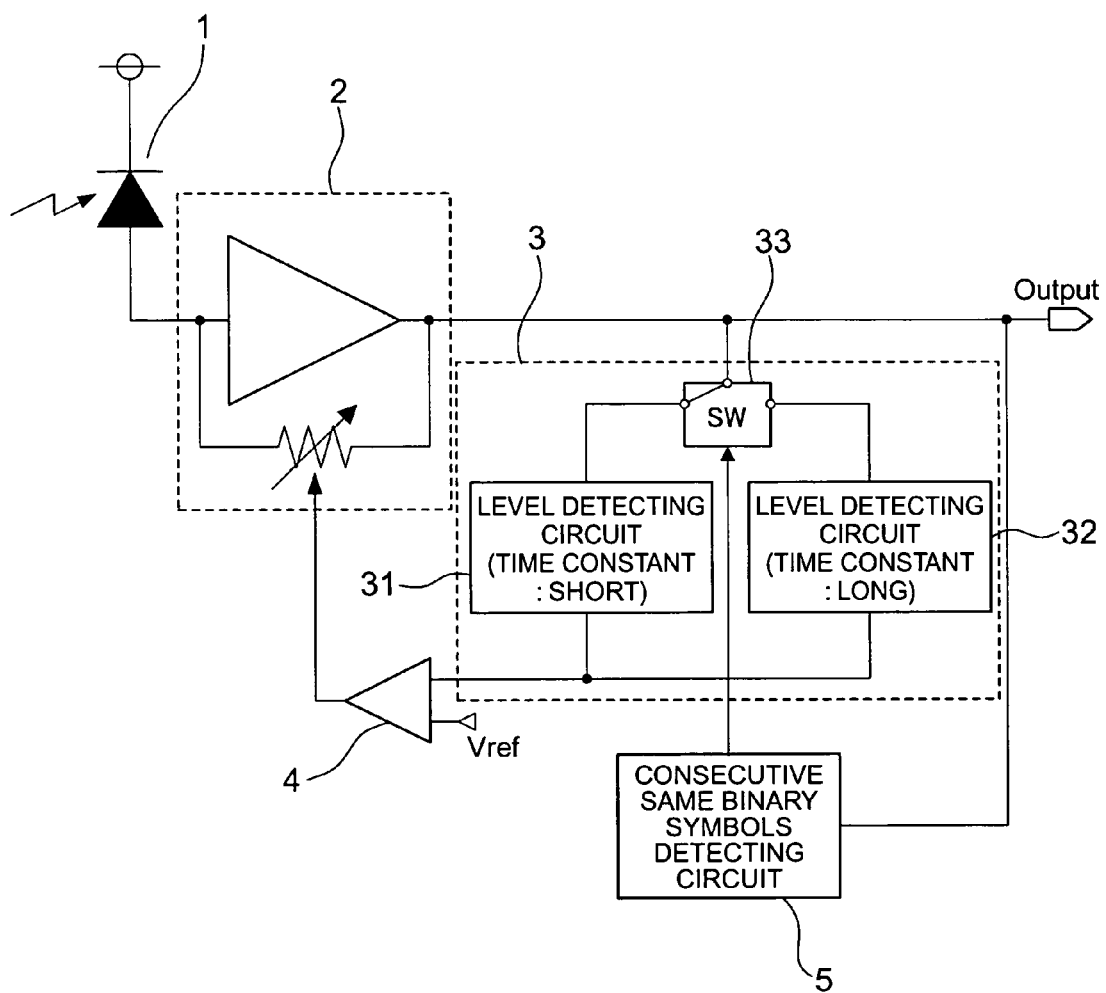
FIG. 1 is a block diagram showing a structure of an optical receiver according to Embodiment 1 of the present invention.

Referring now to the accompanying drawings, a detailed description is made of optical receivers according to the present invention. It should be noted that the present invention is not limited to embodiments shown in the drawings.

Embodiment 1

FIG. 1 is a block diagram showing a structure of an optical receiver according to Embodiment 1 of the present invention. As shown in FIG. 1, a light receiving element 1, which has a cathode connected to a power supply and an anode connected to an input terminal of a preamplifier 2, outputs a current corresponding to a light receiving level of a received optical signal. The preamplifier 2 converts the current outputted from the light receiving element 1 into a voltage and outputs the converted voltage, while a conversion gain thereof for converting the current into the voltage is controlled in a variable manner in response to a control voltage which is inputted from the outside.

A level detecting circuit 3 detects an average value of a voltage signal outputted from the preamplifier 2. The level detecting circuit 3 includes a level detecting unit 31 whose time constant is short, a level detecting unit 32 whose time constant is long, and a time constant switch 33 for switching the time constants. An output voltage of the level detecting circuit 3 is amplified by an amplifier 4 to a desired control voltage, and thus, the desired control voltage controls the conversion gain of the preamplifier 2. Also, a consecutive same binary symbols detecting circuit 5 detects a consecutive same binary symbols portion from a binary symbols stream of an electric signal outputted from the preamplifier 2, and then outputs a detection result thereof to the time constant switch 33 as a time constant switching signal.

It should be noted that the time constant switch 33 of the level detecting circuit 3 selects and connects the level detecting unit 32 whose time constant is long, in a case where the consecutive same binary symbols detecting circuit 5 detects the consecutive same binary symbols, namely, when the same binary symbols are consecutive in such a manner that a bit stream of a received signal appears as "1, 1, 1, 1, . . . " or "0, 0, 0, 0, . . . ". While in a case where the consecutive same binary symbols detecting circuit 5 does not detect the consecutive same binary symbols, namely, when binary symbols are frequently inverted in such a manner that a bit stream of a received signal appears as "1, 0, 1, 0, . . . ", the time constant switch 33 selects and connects the level detecting unit 33 whose time constant is short.

In other words, when the same binary symbols of "1" or "0" is continued in the bit stream of the received signal, the level detecting circuit 3 is operated as a level detecting circuit whose time constant is long, whereas in any case other than the above-mentioned case, the level detecting circuit 3 is operated as a level detecting circuit whose time constant is short.

Figure 2:
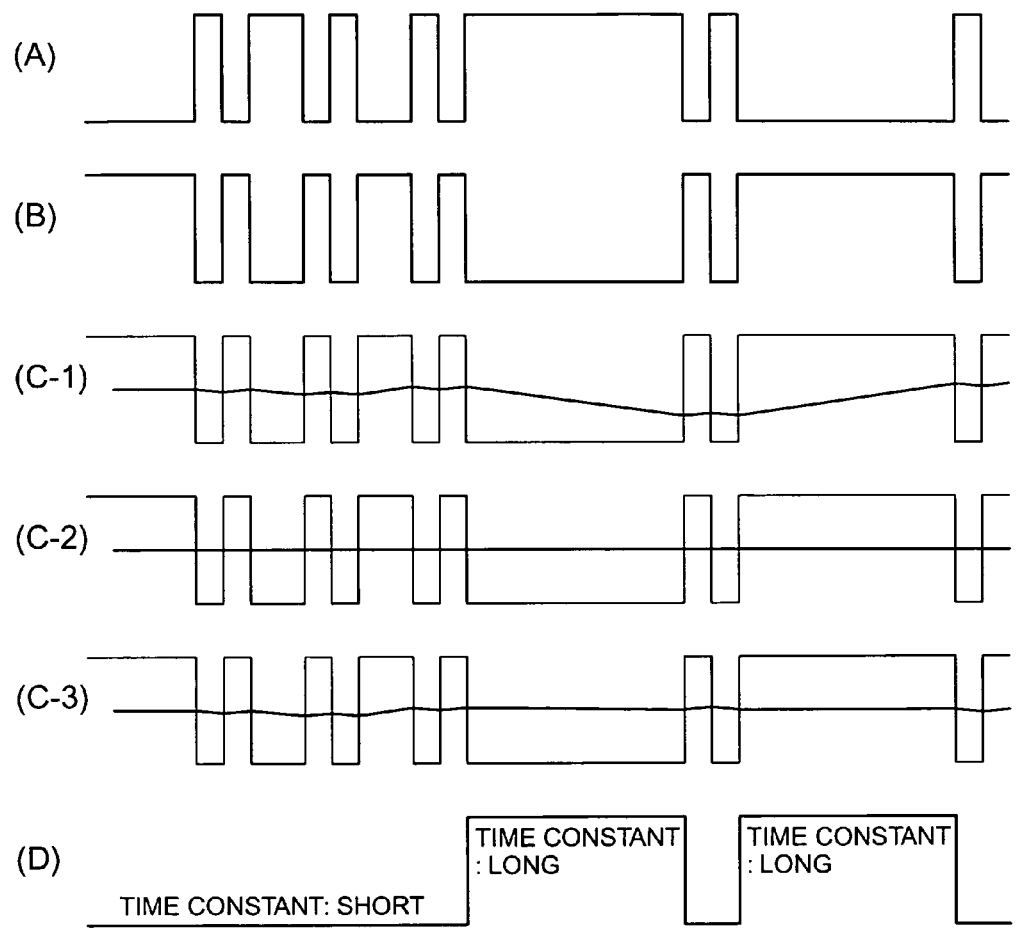
FIG. 2 is a timing waveform diagram showing signal waveforms of respective portions of FIG. 1.

Next, FIG. 2 is a timing waveform diagram showing signal waveforms appeared in respective circuit portions of FIG. 1: (A) shows an output current of the light receiving element 1; (B) shows an output voltage of the preamplifier 2; (C-1) shows an output voltage of the level detecting circuit 3 in a case where the level detecting unit 31 whose time constant is short is continuously employed; (C-2) shows an output voltage of the level detecting circuit 3 in a case where the level detecting unit 32 whose time constant is long is continuously employed; (C-3) shows an output voltage of the level detecting circuit 3 in the case where the time constant switch 33 is switched based upon a detection result of the consecutive same binary symbols detecting circuit 5; and (D) shows an output voltage of the consecutive same binary symbols detecting circuit 5. It should be noted that the signal waveforms of "C-1", "C-2", and "C-3" are displayed by being superimposed on the signal waveform of "B" in order to clarify a relationship between those output voltages and the output voltage of the preamplifier 2.

A description is made of operations and a feature of the optical receiver according to Embodiment 1 of the present invention with reference to FIG. 2. In FIG. 2, "C-1" shows the output voltage of the level detecting circuit 3 when the level detecting circuit 31 whose time constant is short is continuously employed. Since the time constant is short, the level detecting unit 31 has an excellent high-speed responsiveness. To the contrary, when the same binary symbols are consecutive, a level detecting error becomes larger, so the level detecting unit 31 can hardly and constantly control the desired conversion gain.

On the other hand, (C-2) shows the output voltage of the level detecting circuit 3 when the level detecting unit 32 whose time constant is long is continuously employed. Since the time constant is long, even when the same binary symbols are consecutive, the level detecting unit 32 can detect the levels thereof with high precision, and can constantly control the desired conversion gain. To the contrary, because the level detecting unit 32 can have poor high-speed responsiveness, the level detecting unit 32 is not suitable for receiving a burst signal.

(C-3) shows the output voltage of the level detecting circuit in a case where the time constant of the level detecting circuit 3 is switched by the time constant switch 33 which constitutes the level detecting circuit 3 based upon the output voltage (D) of the consecutive same binary symbols detecting circuit 5. When the same binary symbols are consecutive, the level detecting circuit 3 performs the level detecting operation with the long time constant, and in other cases, performs the level detecting operations with the short time constant. As a consequence, even when the same binary symbols are consecutive, the level detecting circuit 3 can detect the levels thereof with high precision, and can constantly control the desired conversion gain, and further, can have the excellent high-speed responsiveness.

In the optical receiver arranged and operable in the above-mentioned manner, the switching operation of the time constants and the AGC function achieved in the level detecting circuit 3 have the below-mentioned features. That is, when the burst signal is received, the time constant switching operation and the AGC function are continuously effected in response to the bit stream. Even when a reception level is changed within a single packet, the time constant switching operation and the AGC function of the level detecting circuit 3 can also follow the reception level change. Also, there is no necessity to provide a specific bit stream at a packet head portion.

It should be noted that as the operation of the consecutive same binary symbols detecting circuit 5, an assumption that the consecutive same binary symbols occurs when certain bits, or more bits of the same binary symbols continuously appear is determined by checking whether or not the consecutive same binary symbols detecting circuit 5 realizes the consecutive same binary symbols tolerance with respect to certain bits, or more bits of the same binary symbols.

As previously described, in accordance with Embodiment 1 of the present invention, there can be realized the optical receiver including: the preamplifier 2 whose conversion gain can be changed; the level detecting circuit 3 whose time constants can be switched; and the consecutive same binary symbols detecting circuit 5 for analyzing the bit stream of the received signal to detect the same binary symbols continuous portion thereof. The optical receiver controls the level detecting circuit 3 in such a manner that the time constant thereof becomes long when the same binary symbols are consecutive based upon the detection result of the consecutive same binary symbols detecting circuit 5, whereas controls the level detecting circuit 3 in such a manner that the time constant of the level detecting circuit 3 becomes short when different binary symbols are consecutive based upon the detection result of the consecutive same binary symbols detecting circuit 5. Moreover, because the conversion gain of the preamplifier 2 is controlled based upon the detection results of the level detecting circuit 3 controlled in the above-mentioned manner, the optical receiver can have a wide dynamic range characteristic capable of stably reproducing packets having different light receiving levels, and has the excellent high-speed responsiveness and the excellent consecutive same binary symbols tolerance.

Embodiment 2

Figure 3:
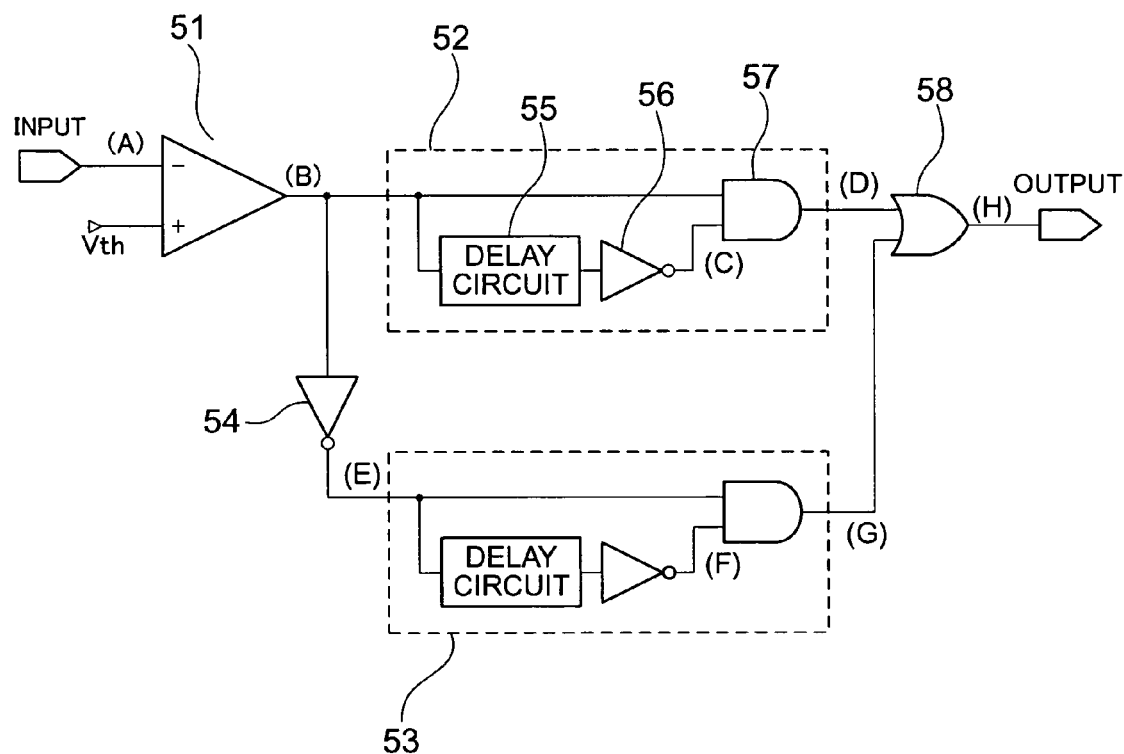
FIG. 3 is a block diagram showing a structure of a consecutive same binary symbols detecting circuit 5 in an optical receiver according to Embodiment 2 of the present invention.

FIG. 3 is a block diagram showing a structure of a consecutive same binary symbols detecting circuit 5 of an optical receiver according to Embodiment 2 of the present invention. The consecutive same binary symbols detecting circuit 5 shown in FIG. 3 represents an internal structure of the consecutive same binary symbols detecting circuit 5 indicated in FIG. 1, and includes a comparator 51, a rising change point detecting unit 52, a falling change point detecting unit 53, and a NOR element 58. The comparator 51 compares a voltage signal outputted from the preamplifier 2 with a predetermined threshold. The rising change point detecting unit 52 detects a change point of a binary symbols stream based upon a comparison result of the comparator 51. The falling change point detecting unit 53 detects a change point of a binary symbols stream based upon a comparison result of the comparator 51 obtained through a NOT element 54. The NOR element 58 logically calculates the change point detection result of the rising change point detecting unit 52 and the change point detection result of the falling change point detecting unit 53 to output a "Low" level when any one of the change point detection results becomes a "High" level.

In this case, the rising change point detecting unit 52 and the falling change point detecting unit 53 include circuits equivalent to each other. Each of the rising change point detecting unit 52 and the falling change point detecting unit 53 contains a delay circuit 55, a NOT element 56, and an AND element 57 which AND-gates both a signal supplied via the delay circuit 55 and the NOT element 56 and another signal supplied not via the delay circuit 55 and the NOT element 56.

Next, a description is made of operations of the consecutive same binary symbols detecting circuit 5 shown in FIG. 3. A voltage signal outputted from the preamplifier 2 is inputted to the comparator 51. As a result of comparing the input voltage signal with a threshold voltage "Vth", when the input voltage is higher than the threshold voltage "Vth", the comparator 51 outputs a "Low" level, whereas when the input voltage is lower than the threshold voltage "Vth", the comparator 51 outputs a "High" level. The output signal of the comparator 51 is divided into two. One divided output signal is entered to the rising change point detecting unit 52, and another divided output signal is inverted by the NOT element 54, and thereafter, entered to the falling change point detecting unit 53. The rising change point detection result and the falling change point detection result are logically calculated by the NOR element 58, and then, the NOR-gated signal becomes an output signal of the consecutive same binary symbols detecting circuit 5.

The change point detecting circuits 52 and 53 are equivalent circuits. A signal entered to each of the change point detecting circuits 52 and 53 is divided into two. One divided signal is inputted to the AND element 57, and another divided signal is delayed by a desired delay time by the delay circuit 55, and thereafter, inverted by the NOT element 56, and further to be inputted to the AND element 57. Then, the AND element 57 performs AND-gating process operation with respect to the respective input signals, and outputs the AND-gated result.

Figure 4:
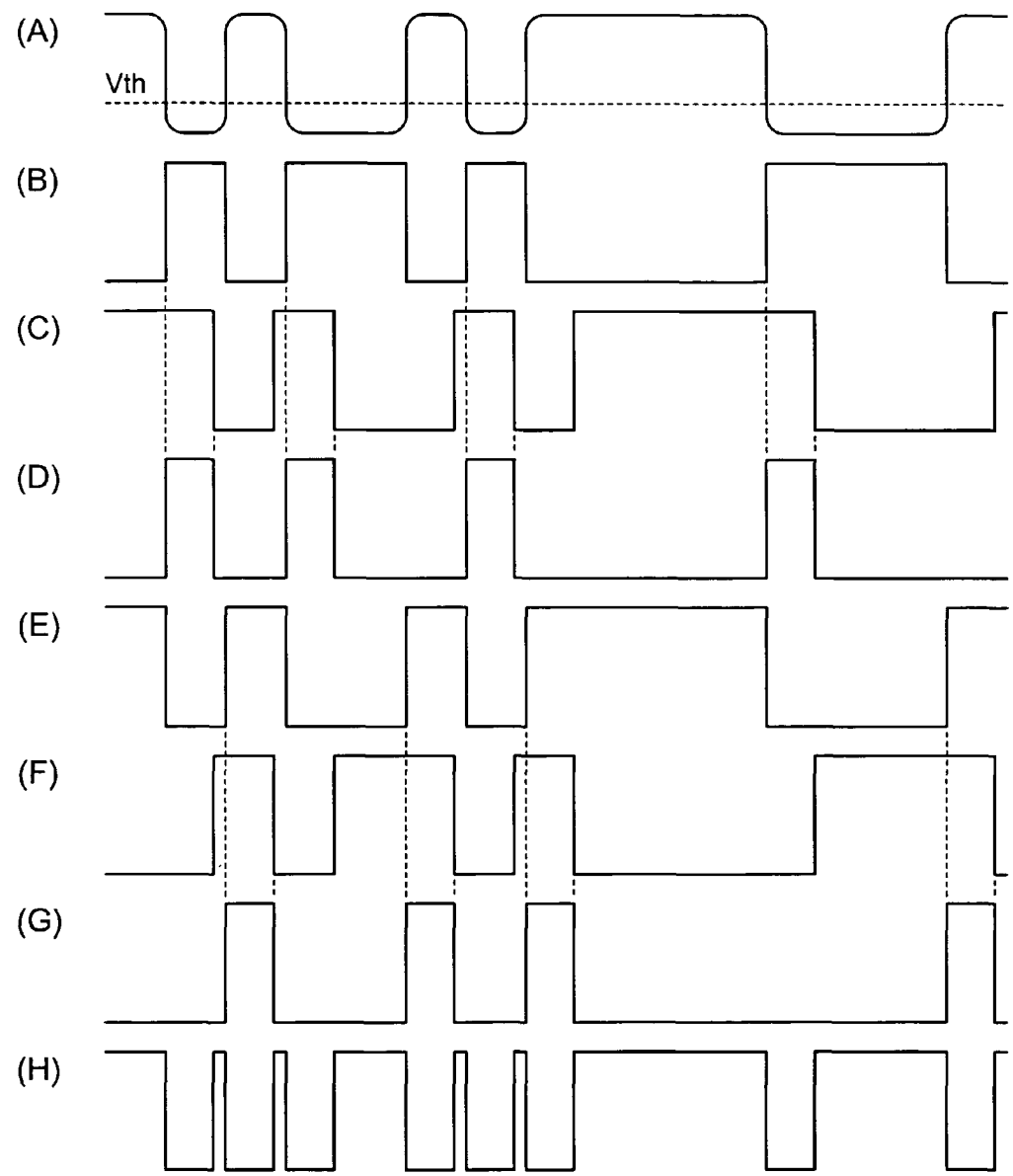
FIG. 4 is a timing waveform diagram showing signal waveforms of respective circuit portions of FIG. 3.

FIG. 4 is a timing waveform diagram showing signal waveforms of the respective portions of FIG. 3: (A) shows an input signal of the comparator 51; (B) shows an output signal of the comparator 51 which compares the input signal and the threshold voltage "Vth"; (C) shows a signal produced by delaying and inverting the input signal of the rising change point detecting unit 52; (D) shows an output signal of the rising change point detecting unit 52; (E) shows an input signal of the falling change point detecting unit 53; (F) shows a signal produced by delaying and inverting an input signal of the falling change point detecting unit 53; (G) shows an output signal of the falling change point detecting unit 53; and (H) shows an output signal obtained by that an output signal of the falling change point detecting unit 53 is NOR-gated with an output signal of the rising change point detecting unit 52.

Referring now to FIG. 4, a description is made of operations and features of the optical receiver according to Embodiment 2 of the present invention. (A) shows a relationship between an input signal of the comparator 51 and the threshold voltage "Vth". In (B), when the input voltage is higher than the threshold voltage "Vth", a signal having a "Low" level is outputted, whereas when the input voltage is lower than the threshold voltage "Vth", a signal having a "High" level is outputted.

A signal shown in (C) is a signal produced by delaying and inverting the signal of (B). In order to realize a desired operation, it is preferable to set a delay amount of the signal to be approximately 1 bit. A signal of (D) is obtained by AND-gating the signal shown in (B) and the signal of (C). While "Hight" is outputted at a point where a signal level in the bit stream of (B) is changed from "Low" to "High", namely, at a rising change point, the rising change point detecting unit 52 is operated as a circuit for detecting a rising point in a bit stream of an input signal.

A signal of (E) is a signal obtained by inverting the signal of (B), and is inputted to the falling change point detecting unit 53. The falling change point detecting unit 53 is operated in a similar manner to that of the rising change point detecting unit 52, the signal of (E) is a signal produced by inverting the input signal, so the falling change point detecting unit 53 is operated as a circuit for detecting a falling point in the bit stream of the input signal.

A signal of (H) is an output signal produced by NOR-gating the output signal of the rising change point detecting unit 52 and the output signal of the falling change point detecting unit 53.

As a consequence, the consecutive same binary symbols detecting circuit 5 is operated in such a manner that while the consecutive same binary symbols detecting unit 5 detects a change point from "0" to "1" or from "1" to "0" with respect to the bit stream of the input signal of "A", when the change point is detected, a signal having a "Low" level is outputted. In other words, in a case where the same binary symbols are consecutive in the bit stream of the input signal, the consecutive same binary symbols detecting circuit 5 outputs a signal having a "High" level and is operated as a consecutive same binary symbols detecting circuit.

It should be noted that only when a voltage amplitude of an input signal is below the threshold voltage "Vth" of the comparator 51, the consecutive same binary symbols detecting circuit 5 is operated. In other words, in a case where an output voltage amplitude of the preamplifier 2 is small, namely, a light receiving level is low, the consecutive same binary symbols detecting circuit 5 is not operated.

In such a case, because the switching operation of the time constant of the level detecting circuit 3 is not carried out, when the same binary symbols are consecutive, there is a fear that the level detecting operation cannot be carried out with high precision. However, in a case where the light receiving level is originally low, the conversion gain of the preamplifier 2 may be merely fixed to become maximum. In other words, in the preamplifier 2, two light receiving level ranges are present, namely, a light receiving level range within which the preamplifier 2 is operated with the maximum conversion gain; and another light receiving level range within which the preamplifier 2 is operated by being controlled to have a desired conversion gain. It is desirable that the threshold voltage "Vth" of the comparator 51 be set in such a manner that the comparator 51 may be operated in response to an output amplitude of the preamplifier 2 in a light receiving level of the threshold value thereof.

Also, the consecutive same binary symbols detecting circuit 5 is operated in the digital manner, whereas the preamplifier 2 is operated in the analog manner. As a result, there is a possibility that the preamplifier 2 is erroneously operated due to an adverse influence caused by digital noise produced when the consecutive same binary symbols detecting circuit 5 is operated.

A probability at which the preamplifier 2 is erroneously operated due to a ratio of the above-mentioned digital noise with respect to a current signal converted by the light receiving element 1 in the photoelectric converting manner, so the lower the light receiving level becomes, the lager the influence caused by the digital noise becomes.

However, in the consecutive same binary symbols detecting circuit 5, the light receiving level range within which the consecutive same binary symbols detecting circuit 5 is operated can be set based upon the threshold voltage "Vth" of the comparator 51, and the consecutive same binary symbols detecting circuit 5 can be operated only in a case where a signal having a level higher than, or equal to a certain constant level is received.

That is to say, it is preferable that the threshold voltage of the comparator 51 be set in such a manner that the light receiving level range where the consecutive same binary symbols detecting circuit 5 is operated may become equal to the light receiving level range where the gain of the preamplifier 2 is controlled in the variable manner based upon the detection result obtained from the level detecting circuit 3.

As described above, in accordance with Embodiment 2 of the present invention, the optical receiver is provided with the consecutive same binary symbols detecting circuit 5 operable in the below-mentioned manner. The consecutive same binary symbols detecting circuit 5 can set the light receiving level range within which The consecutive same binary symbols detecting circuit 5 itself is operated based upon the threshold voltage "Vth" of the comparator 51, and detects the change point from "0" to "1" or "1" to "0" with respect to the bit stream of the input signal, and further, when the change point is detected, outputs the signal having the "Low" level. As a consequence, there can be realized the optical receiver which has a wide dynamic range characteristic to stably reproduce packets having different light receiving levels, and has the excellent high-speed responsiveness and the excellent consecutive same binary symbols tolerance.

Embodiment 3

Figure 5:
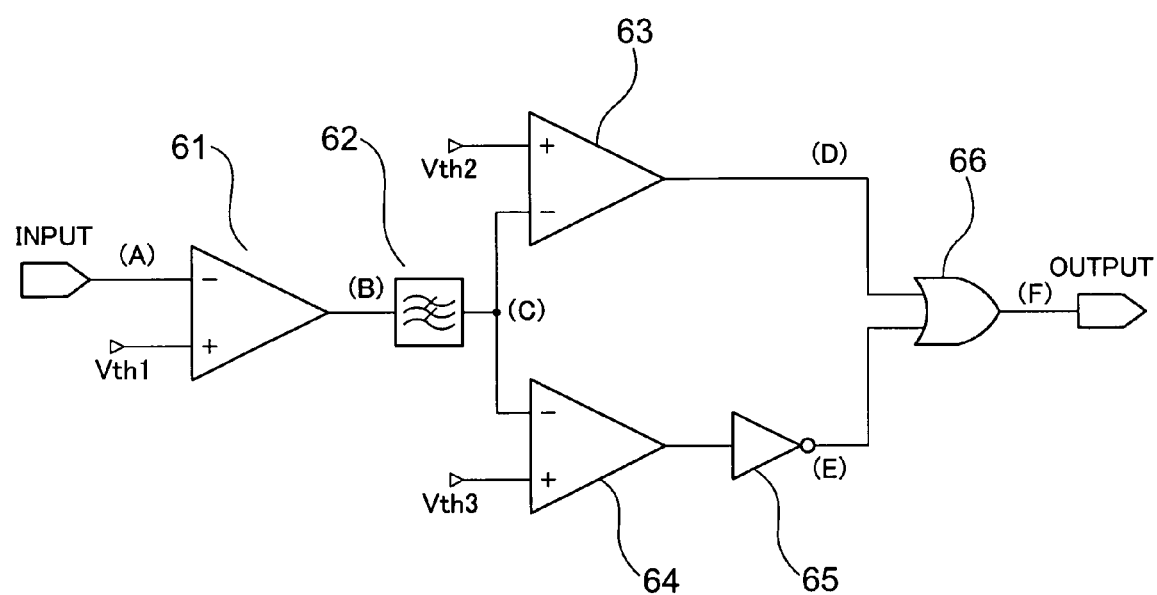
FIG. 5 is a block diagram showing a structure of a consecutive same binary symbols detecting circuit 5 in an optical receiver according to Embodiment 3 of the present invention.

FIG. 5 is a block diagram showing a structure of a consecutive same binary symbols detecting circuit 5 employed in an optical receiver according to Embodiment 3 of the present invention. The consecutive same binary symbols detecting circuit 5 shown in FIG. 5 represents an internal structure of the consecutive same binary symbols detecting circuit 5 shown in FIG. 1, and is equipped with: a threshold comparison comparator 61; a low-pass filter 62; amplitude detection comparators 63 and 64; and a NOR element 66. The threshold comparison comparator 61 compares a voltage signal outputted from the preamplifier 2 with a predetermined threshold. The low-pass filter 62 limits a pass band for a comparison result of the above-mentioned comparator 61. The amplitude detection comparators 63 and 64 to detect an output amplitude of a signal which has passed through the low-pass filter 62. The NOR element 66 outputs a "Low" level when any one of an output from the comparator 63 and another output from the comparator 64 via the NOT element 65 becomes a "High" level.

Next, a description is made of operations of the consecutive same binary symbols detecting circuit 5 shown in FIG. 5. A voltage signal outputted from the preamplifier 2 is inputted to the comparator 61. As a result of comparing the input voltage signal with a threshold voltage "Vth1", when the input voltage is higher than the threshold voltage "Vth1", the comparator 61 outputs a "Low" level, whereas when the input voltage is lower than the threshold voltage "Vth1", the comparator 61 outputs a "High" level. The output signal of the comparator 61 is divided into two after the output signal has passed through the low-pass filter 62. One divided output signal is entered to the comparator 63 for detecting a symbol "1" continuation, whereas another divided output signal is entered to the comparator 64 for detecting a symbol "0" continuation. An output signal of the comparator 64 is inverted by the NOT element 65, and then, the inverted signal and the output signal of the comparator 63 are OR-gated by an OR element 66.

Figure 6:
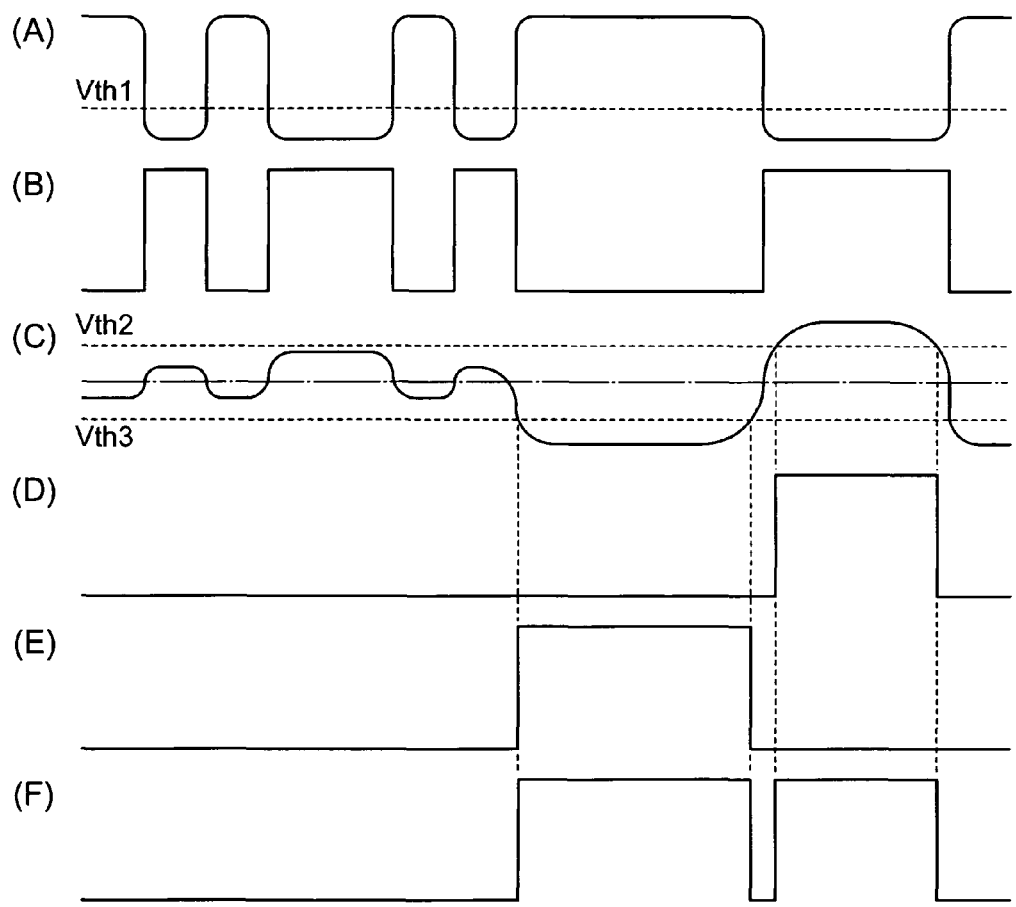
FIG. 6 is a timing waveform diagram showing signal waveforms of respective portions of FIG. 5.

FIG. 6 is a timing waveform diagram showing signal waveforms appeared in the respective portions of FIG. 5: (A) shows an input signal of the comparator 61; (B) shows an output signal of the comparator 61 which compares the input signal and the threshold voltage "Vth1"; (C) shows an output signal of the low-pass filter 62 which enters the output signal of the comparator 61 as an input signal; (D) shows an output signal of the comparator 63 when an input signal is compared with a threshold voltage "Vth2"; (E) shows a signal produced by inverting the output signal of the comparator 64 when the input signal is compared with a threshold voltage "Vth3"; and (F) shows an output signal obtained by OR-gating the output signal of the comparator 63 and the inverted output signal of the comparator 64.

Referring now to FIG. 6, a description is made of operations and features of the optical receiver according to Embodiment 3 of the present invention: (A) shows a relationship between an input signal of the comparator 61 and the threshold voltage "Vth1"; and in (B), when the input voltage is higher than the threshold voltage "Vth1", a signal having a "Low" level is outputted, whereas when the input voltage is lower than the threshold voltage "Vth2", a signal having a "High" level is outputted.

(C) shows an output signal which has passed through the low-pass filter 62 when the signal shown in (B) is entered as the input signal, and also shows a relationship between the threshold voltages "Vth2" and "Vth3". Since the high frequency signal component is attenuated by the low-pass filter 62, a high frequency bit stream in which the binary symbols "1" and "0" are alternately continued, and an amplitude thereof becomes small. While in a low frequency bit stream in which the binary symbols "1" and "0" are continued, an amplitude thereof is not so changed. As a consequence, if the cut off frequency of the low-pass filter 62 and the threshold voltages "Vth2" and "Vth3" are optimized, when the same binary symbols having certain bits or larger is continued, the consecutive same binary symbols portions can be detected as shown in (D) and (E).

In other words, when the cut off frequency of the low-pass filter 62 and the threshold voltages of the comparators 63 and 64 are adjusted, it is possible to obtain the consecutive same binary symbols detecting circuit 5 capable of changing a number of consecutive same binary symbols to be detected.

As described above, in accordance with Embodiment 3 of the present invention, the optical receiver is equipped with the consecutive same binary symbols detecting circuit 5 capable of changing a number of consecutive same binary symbolss to be detected through adjustment of the cut off frequency of the low-pass filter 62 and the threshold voltages of the comparators 63 and 64. As a consequence, there can be realized the optical receiver which has a wide dynamic range characteristic to stably reproduce packets having different light receiving levels, and has the excellent high-speed responsiveness and the excellent consecutive same binary symbols tolerance.

Embodiment 4

Figure 7:
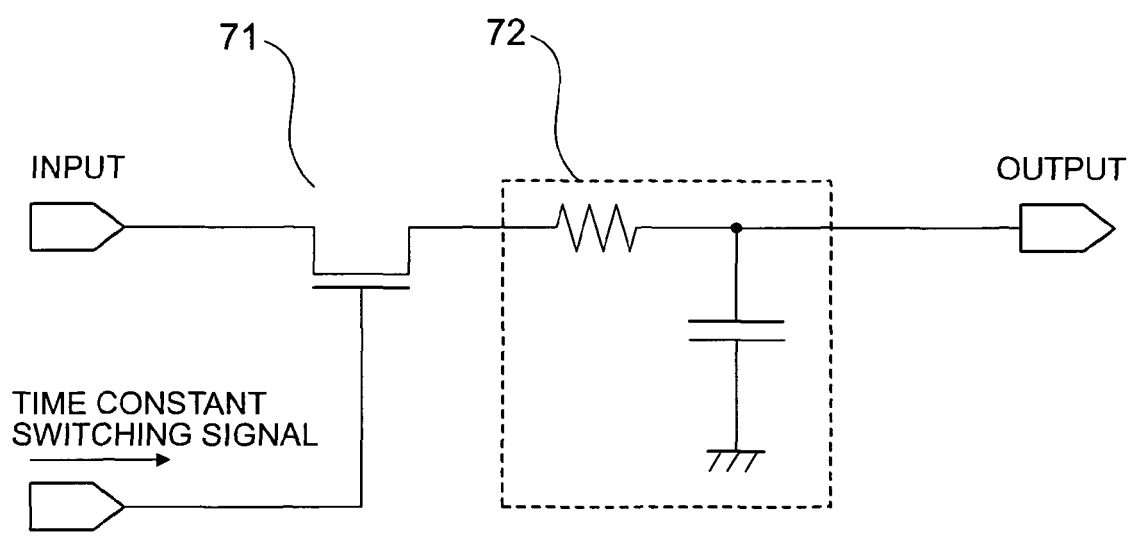
FIG. 7 is a block diagram showing a structure of a level detecting circuit 3 in an optical receiver according to Embodiment 4 of the present invention.

FIG. 7 is a block diagram showing a structure of a level detecting circuit 3 employed in an optical receiver according to Embodiment 4 of the present invention. The level detecting circuit 3 shown in FIG. 7 shows another structural example of the level detecting circuit 3 shown in FIG. 1, and is equipped with an FET 71, and a low-pass filter 72. In the FET 71, a resistance value between a drain and a source thereof is changed in response to a time constant switching signal derived from the consecutive same binary symbols detecting circuit 5, which is applied to a gate thereof. The low-pass filter 72 is connected to the source or the drain of the FET 71.

Next, a description is made of operations of the level detecting circuit 3 shown in FIG. 7. The FET 71 is provided at a prestage of the low-pass filter 72, the source or the drain of the FET 71 is connected to the low-pass filter 72, and the time constant switching signal produced by the consecutive same binary symbols detecting circuit 5 is entered to the gate of the FET 71.

Since the FET 71 has such a characteristic that the resistance value between the drain and the source is changed by the voltage applied between the gate and the source, the time constant of the level detecting circuit 3 can be changed by the voltage applied to the gate of the FET 71.

In other words, in a case where the consecutive same binary symbols detecting circuit 5 connected to the gate of the FET 71 outputs a "Low" level signal during detection of the consecutive same binary symbols, if the FET 71 is formed of an n-channel MOS, when the consecutive same binary symbols is detected, the FET 71 is brought into an OFF state, namely, the drain-to-source path becomes an extremely large resistance value. As a result, the time constant of the level detecting circuit 3 becomes long.

On the other hand, when the different symbol continuation is detected, the consecutive same binary symbols detecting circuit 5 outputs a "High" level signal, and the FET 71 is brought into an ON state, namely, the drain-to-source path becomes an extremely small resistance value. As a result, the time constant of the level detecting circuit 3 becomes short.

As described above, in accordance with Embodiment 4 of the present invention, the optical receiver is equipped with the level detecting circuit 3 including the low-pass filter 72 and the FET 71 whose resistance value is changed by the gate voltage thereof, and the gate voltage thereof is controlled by the output signal from the consecutive same binary symbols detecting circuit 5. As a consequence, there can be realized the optical receiver which has a wide dynamic range characteristic to stably reproduce packets having different light receiving levels and has the excellent high-speed responsiveness and the excellent consecutive same binary symbols tolerance.

The invention claimed is:

1. An optical receiver, comprising:
 a light receiving element for outputting a current in response to a light receiving level of an optical signal;
 a preamplifier whose gain is controlled in a variable manner based upon a control voltage, for converting the current signal outputted from the light receiving element into a voltage signal;
 a consecutive same binary symbols detecting circuit that detects a consecutive same binary symbols portion from a binary symbols stream of the voltage signal outputted from the preamplifier to output a time constant switching signal in response to a detection result thereof;
 a level detecting circuit that detects a voltage level of the voltage signal outputted from the preamplifier based upon a time constant which is switched/controlled in response to the time constant switching signal from the consecutive same binary symbols detecting circuit; and
 an amplifier that amplifies an output voltage of the level detecting circuit to apply a control voltage for controlling the gain to the preamplifier,
 wherein the consecutive same binary symbols detecting circuit includes:
 a threshold comparison comparator for comparing the voltage signal outputted from the preamplifier with a predetermined threshold;
 a low-pass filter for restricting a pass band of a comparison result of the comparator; and
 an amplitude detection comparator for detecting an output amplitude of the signal which has passed through the low-pass filter.

2. The optical receiver according to claim 1, wherein: the level detecting circuit includes:
a level detecting unit whose time constant is short;
a level detecting unit whose time constant is long; and
a time constant switch for selecting the time constants; and
in a case where the consecutive same binary symbols detecting circuit detects a consecutive same binary symbols, the time constant switch selects/connects the level detecting unit whose time constant is long, whereas in a case where the consecutive same binary symbols detecting circuit does not detect the consecutive same binary symbols, the time constant switch selects/connects the level detecting unit whose time constant is short.

3. The optical receiver according to claim 1, wherein the level detecting circuit includes:
an FET in which a resistance value between a drain and a source of the FET is changed based upon the time constant selecting signal outputted from the consecutive same binary symbols detecting circuit and applied to a gate thereof; and
a low-pass filter connected to the source or the drain of the FET.

4. The optical receiver according to claim 1, wherein the consecutive same binary symbols detecting circuit includes:
a change point detecting unit that detects a change point of the binary symbols stream based upon a comparison result of the comparator.

5. The optical receiver according to claim 4, wherein the comparator sets the threshold in such a manner that a light receiving level range in which the consecutive same binary symbols detecting circuit operates becomes equal to another light receiving level range in which the gain of the preamplifier is controlled in the variable manner based upon a detection result of the level detecting circuit.

6. An optical receiving method, comprising:
outputting a current in response to a light receiving level of an optical signal;
converting, by utilizing a preamplifier whose gain is controlled in a variable manner based upon a control voltage, the current signal outputted from the light receiving element into a voltage signal;
detecting a consecutive same binary symbols portion from a binary symbols stream of the voltage signal outputted from the preamplifier to output a time constant switching signal in response to a detection result thereof;
detecting a voltage level of the voltage signal outputted from the preamplifier based upon a time constant which is switched/controlled in response to the time constant switching signal from the consecutive same binary symbols detecting step; and
amplifying an output voltage of the level detecting step to apply a control voltage for controlling the gain to the preamplifier,
wherein the consecutive same binary symbols detecting step further comprising:
comparing the voltage signal outputted from the preamplifier with a predetermined threshold;
restricting, by utilizing a low-pass filter, a pass band of a comparison result of the comparing step; and
detecting an output amplitude of the signal which has passed through the low-pass filter.

7. The optical receiving method according to claim 6, further comprising:
providing a level detecting unit whose time constant is short;
providing a level detecting unit whose time constant is long; and
providing a time constant switch for selecting the time constants; and
in a case where the consecutive same binary symbols detecting step detects a consecutive same binary symbols, the time constant switch selects/connects the level detecting unit whose time constant is long, whereas in a case where the consecutive same binary symbols detecting step does not detect the consecutive same binary symbols, the time constant switch selects/connects the level detecting unit whose time constant is short.

8. The optical receiving method according to claim 6, further comprising:
providing an FET in which a resistance value between a drain and a source of the FET is changed based upon the time constant selecting signal outputted from the consecutive same binary symbols detecting step and applied to a gate thereof; and
providing a low-pass filter connected to the source or the drain of the FET.

9. The optical receiving method according to claim 6, wherein the consecutive same binary symbols detecting step further comprising:
detecting a change point of the binary symbols stream based upon a comparison result of the comparator.

10. The optical receiving method according to claim 9, further comprising: setting the threshold in such a manner that a light receiving level range becomes equal to another light receiving level range in which the gain of the preamplifier is controlled in the variable manner based upon a detection result of the level detecting step.

* * * * *